(12) United States Patent
Jeng et al.

(10) Patent No.: US 8,519,537 B2
(45) Date of Patent: Aug. 27, 2013

(54) 3D SEMICONDUCTOR PACKAGE INTERPOSER WITH DIE CAVITY

(75) Inventors: Shin-Puu Jeng, Hsin-Chu (TW); Kim Hong Chen, Fremont, CA (US); Shang-Yun Hou, Hsin-Chu (TW); Chao-Wen Shih, Zhubei (TW); Cheng-Chieh Hsieh, Yongkang (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 12/813,212

(22) Filed: Jun. 10, 2010

(65) Prior Publication Data

US 2011/0210444 A1 Sep. 1, 2011

Related U.S. Application Data

(60) Provisional application No. 61/308,561, filed on Feb. 26, 2010.

(51) Int. Cl.
*H01L 23/13* (2006.01)
*H01L 23/538* (2006.01)
*H01L 23/488* (2006.01)

(52) U.S. Cl.
USPC ............ 257/738; 257/E23.023; 257/E21.509; 257/E23.173; 257/777; 257/737; 257/686; 257/685; 257/723; 257/773; 257/774; 257/668; 257/727; 257/728; 257/778

(58) Field of Classification Search
USPC .......... 275/738, 737, 777, E23.173, E21.509, 275/275/E23.023, 686, 685, 723, 727, 728, 275/778, 724, 668, 773, 774
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |

(Continued)

FOREIGN PATENT DOCUMENTS

JP 4339309 B2 10/2009

OTHER PUBLICATIONS

Ranganathan, N., et al., "Integration of High Aspect Ratio Tapered Silicon Via for Through-Silicon Interconnection," 58th Electronic Components and Technology Conference, ECTC 2008., May 2008, pp. 859-865, IEEE, Lake Buena Vista, Florida, United States.

*Primary Examiner* — Alexander O Williams
(74) *Attorney, Agent, or Firm* — Slater & Matsil, L.L.P.

(57) ABSTRACT

A 3D semiconductor package using an interposer is provided. In an embodiment, an interposer is provided having a first die electrically coupled to a first side of the interposer and a second die electrically coupled to a second side of the interposer. The interposer is electrically coupled to an underlying substrate, such as a packaging substrate, a high-density interconnect, a printed circuit board, or the like. The substrate has a cavity such that the second die is positioned within the cavity. The use of a cavity may allow smaller conductive bumps to be used, thereby allowing a higher number of conductive bumps to be used. A heat sink may be placed within the cavity to aid in the dissipation of the heat from the second die.

19 Claims, 13 Drawing Sheets

(56) References Cited

U.S. PATENT DOCUMENTS

| | | |
|---|---|---|
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,879,041 B2 | 4/2005 | Yamamoto et al. |
| 6,887,769 B2 | 5/2005 | Kellar et al. |
| 6,908,565 B2 | 6/2005 | Kim et al. |
| 6,908,785 B2 | 6/2005 | Kim et al. |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,217,994 B2 * | 5/2007 | Zhu et al. .................. 257/686 |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,632,719 B2 | 12/2009 | Choi et al. |
| 7,659,632 B2 | 2/2010 | Tsao et al. |
| 7,834,450 B2 | 11/2010 | Kang |
| 2007/0289127 A1 | 12/2007 | Hurwitz et al. |
| 2008/0116589 A1 * | 5/2008 | Li et al. .................. 257/780 |
| 2008/0265434 A1 * | 10/2008 | Kurita .................. 257/777 |
| 2008/0272477 A1 | 11/2008 | Do et al. |
| 2008/0283992 A1 | 11/2008 | Palaniappan et al. |
| 2008/0315372 A1 * | 12/2008 | Kuan et al. .................. 257/659 |
| 2009/0121326 A1 * | 5/2009 | Kim et al. .................. 257/666 |
| 2009/0230531 A1 | 9/2009 | Do et al. |
| 2009/0309212 A1 | 12/2009 | Shim et al. |
| 2010/0102428 A1 * | 4/2010 | Lee et al. .................. 257/686 |
| 2010/0244219 A1 * | 9/2010 | Pagaila et al. .................. 257/686 |
| 2010/0314749 A1 * | 12/2010 | Kurita .................. 257/698 |
| 2011/0024888 A1 * | 2/2011 | Pagaila et al. .................. 257/686 |
| 2011/0278732 A1 * | 11/2011 | Yu et al. .................. 257/774 |
| 2011/0285005 A1 * | 11/2011 | Lin et al. .................. 257/686 |
| 2011/0304999 A1 * | 12/2011 | Yu et al. .................. 361/783 |

* cited by examiner

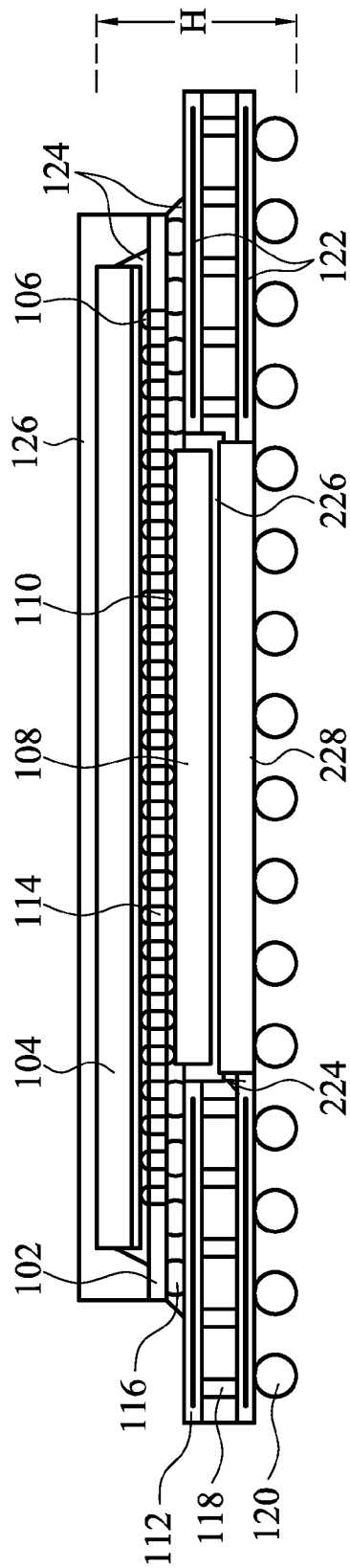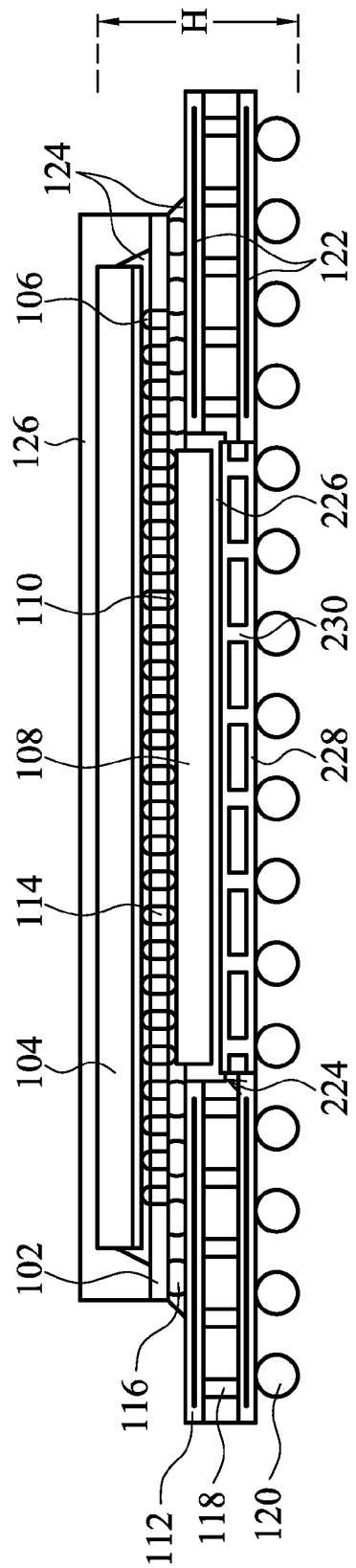

3D SEMICONDUCTOR PACKAGE INTERPOSER WITH DIE CAVITY

This application claims the benefit of U.S. Provisional Application Ser. No. 61/308,561, filed Feb. 26, 2010, and entitled "3D Semiconductor Device Using An Interposer," which application is hereby incorporated herein by reference.

TECHNICAL FIELD

This disclosure relates generally to semiconductor devices and, more particularly, to 3D semiconductor packages using an interposer.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Another 3D package utilized packaging-on-packaging (PoP) or interposer techniques for stacking dies to reduce form factor. PoP typically includes one packaged die placed over another packaged die, wherein the dies are electrically coupled by solder bumps. The bottom die is then electrically coupled to a packaging substrate. PoP packages, however, are difficult to decrease the form factor. Additionally, packages utilizing an interposer are limited by the pin count to the substrate.

SUMMARY

These and other problems are generally reduced, solved, or circumvented, and technical advantages are generally achieved, by embodiments discussed herein, which provides a 3D semiconductor package using an interposer.

In accordance with an embodiment, an interposer is provided having a first die electrically coupled to a first side of the interposer and a second die electrically coupled to a second side of the interposer. Conductive bumps on the interposer electrically couple the interposer to a substrate, which may be a packaging substrate, a high-density interconnect, a printed circuit board, or the like. The substrate has a cavity such that the second die, which is electrically coupled to the interposer, is positioned within the cavity. The use of a cavity may allow smaller conductive bumps to be used, thereby allowing a higher number of conductive bumps to be used. A thermal pad may be placed within the cavity and/or the substrate may comprise a heat conductive pad to aid in the dissipation of the heat from the second die.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1a-1d illustrate various features and characteristics of various embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1A:
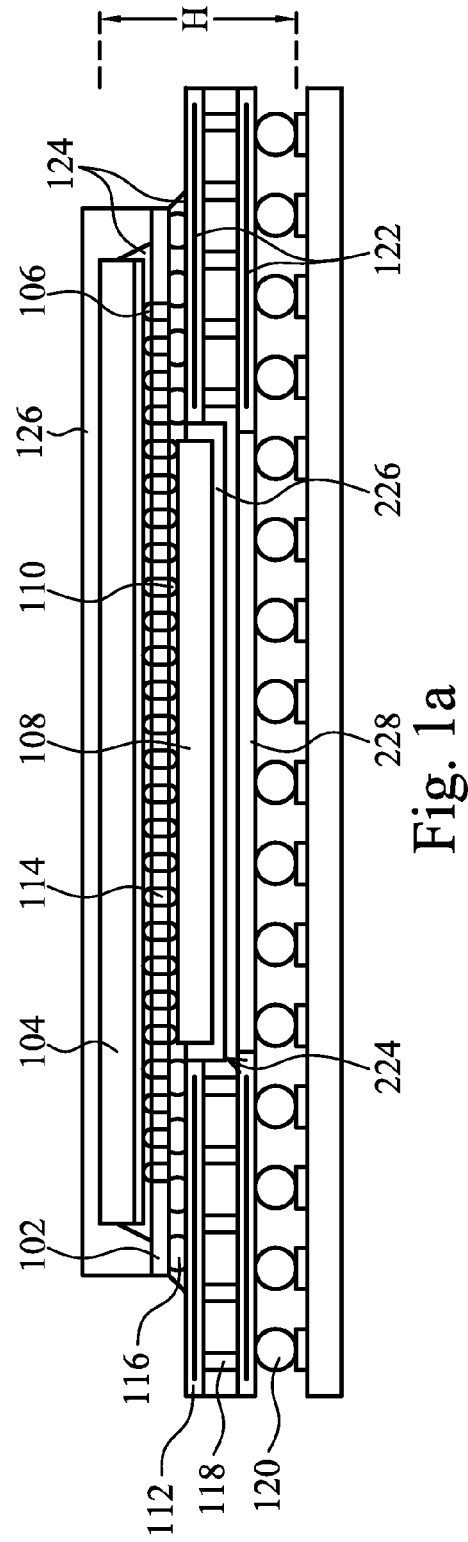

Referring first to FIG. 1a, there is shown a cross-section view of an interposer 102 with a first integrated circuit die 104 attached to a first side of the interposer 102 via a first set of conductive bumps 106 and a second integrated circuit die 108 attached to a second side of the interposer 102 via a second set of conductive bumps 110 in accordance with an embodiment. The first set of conductive bumps 106 and the second set of conductive bumps 110 may comprise, for example, microbumps having a diameter of about 5 microns to about 50 microns.

The interposer 102 is further attached to a substrate 112, which may be, for example, a packaging substrate, another die/wafer, a printed-circuit board, a high-density interconnect, or the like. Through substrate vias (TSVs) 114 in the interposer 102 provide an electrical connection between the first integrated circuit die 104 and the second integrated circuit die 108, as well as between the substrate 112 and one or both of the first integrated circuit die 104 and the second integrated circuit die 108 via a third set of conductive bumps 116. TSVs 118 in the substrate 112 provide an electrical connection between the third set of conductive bumps 116 and a set of conductive balls 120, which may in turn be connected to another substrate (not shown).

The substrate 112 may be any suitable substrate, such as a 1/2/1 laminate substrate, a 4-layer laminate substrate, or the like. Redistribution lines (RDLs), indicated generally by lines 122, within the substrate 112 allow for a different pin configuration as well as a larger conductive ball 120.

The substrate 112 also includes a cavity 224 such that the second integrated circuit die 108 extends into the cavity 224 formed in the underlying substrate 112. As a result of the cavity 224, the size of the third set of conductive bumps may be smaller than what would be possible using a substrate without a cavity, because the size of the third set of conductive bumps no longer needs to be greater than the thickness of the second integrated circuit die 108. It should also be noted that because the size of the third set of conductive bumps may be smaller, it may be possible to increase the pin count available for a same size of interposer 102. As a result, a thinner overall package may be possible.

The first integrated circuit die 104 and the second integrated circuit die 108 may be any suitable integrated circuit die for a particular application. For example, one of the first integrated circuit die 104 and the second integrated circuit die 108 may be a memory chip, such as a DRAM, SRAM, NVRAM, and/or the like, while the other die may be a logic circuit. In an embodiment such as this example, the second integrated circuit die 108 may comprise a DRAM die having a thickness of about 100 µm, the third set of conductive bumps 116 may have a thickness of about such as about 80 µm diameter bumps (about 60 µm collapsed). In contrast, if a substrate is used without a cavity, the third set of conductive bumps 116 may be required to have a larger size, such as about 150 µm, which may collapse to have a thickness of about 120 µm. The larger conductive balls 120 may have a diameter of about 250 µm. Thus, as a result of the cavity 224, the resulting package may have a total height H from the conductive balls 120 to a top surface of the first integrated circuit die 104 of about 0.87 mm, as compared to a total height of about 0.93 mm when using a substrate without a cavity.

The cavity 224 may optionally be filled with a thermal pad or gap filler material 226. The thermal pad 226 may be a conformable material suitable to fill the gap between the second integrated circuit die 108 and the substrate 112. The thermal pad 226 may be a thermally conductive material to conduct heat away from the second integrated circuit die. In an embodiment, the thermal pad 226 is formed of a Therm-A-Gap™ Gels or Interface Materials produced by Chomerics, div. of Parker Hannifin Corp. These materials may, for example, comprise an elastomer with metallic fillers. Other materials, such as a thermal interface material or a polymer may also be used.

Figure 1B:
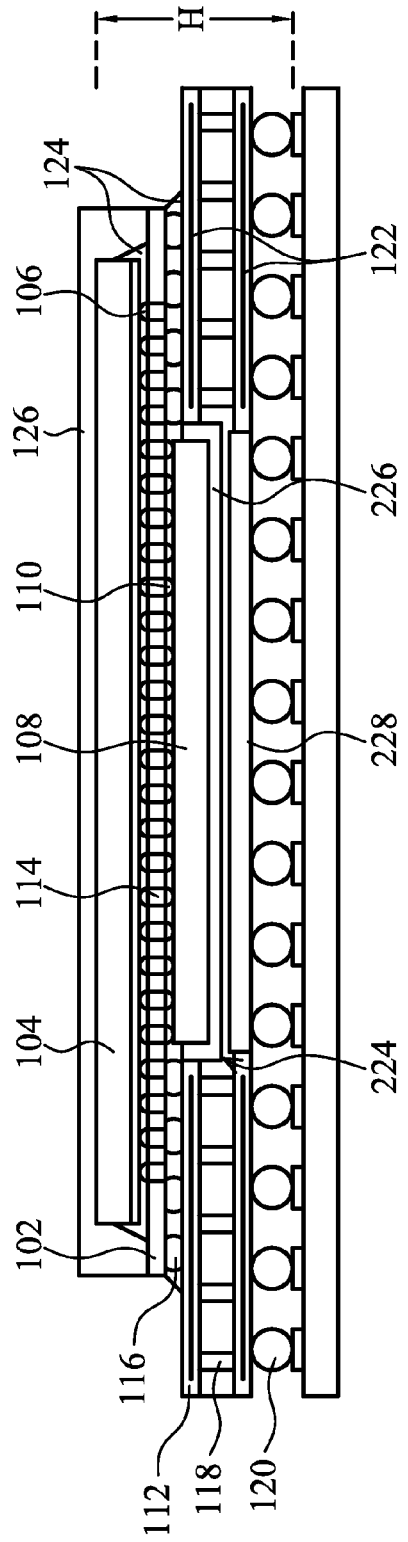

FIG. 1a also illustrates an optional heat conductive pad 228 in the substrate 112. The heat conductive pad 228 may be, for example, a copper pad. The heat conductive pad 228 may have a thickness dependent upon the particular device and the need or desire for additional heat dissipation. For example, FIG. 1a illustrates an embodiment in which the heat conductive pad 228 occupies about 30% of the volume of the substrate below the second integrated circuit die 108. FIGS. 1b and 1c illustrate embodiments in which the heat conductive pad 228 occupies a greater amount, such as 60% and 100%, respectively. It should be noted that depending upon the size of the heat conductive pad 228, the RDL 122 along the bottom side of the substrate 112 may not extend under the second integrated circuit die 108. For example, compare the embodiment illustrated in FIG. 1a, in which the RDL 122 extends between the cavity 224 and a bottom of the substrate 112, to FIG. 1c, in which the RDL 122 is omitted between the cavity 224 and a bottom of the substrate 112 due to the size of the heat conductive pad 228.

In yet another embodiment, thermal vias 230 may be used as illustrated in FIG. 1d. In some embodiments, thermal vias 230 such as those illustrated in FIG. 1d may exhibit performance characteristics similar to a 100% heat conductive pad, but with less heat conductive material (e.g., copper) content and, as a result, may be more cost effective.

FIGS. 1a-1d also illustrate an underfill material 124 placed between the various components, e.g., the first integrated circuit die 104, the second integrated circuit die 108, the interposer 102, and the substrate 112. An encapsulant or overmold 126 may also be formed over the components to protect the components from the environment and external contaminants.

FIGS. 2-9 illustrate a method of forming a semiconductor device such as those illustrated above with reference to FIGS. 1a-1d. It should be noted that the method illustrated in FIGS. 2-9 illustrates a method in which a first die is connected to a first side of an interposer first, followed by forming conductive bumps on a second side of the interposer, placing a second die on the second side of the interposer, and finally, attaching the interposer to a substrate having a cavity formed therein. It should be appreciated that this order is provided for illustrative purposes only, and that other sequences may be used. It should also be noted that the embodiment discussed below assumes that the multiple dies are placed on each side of the interposer, and then the interposer is singulated for placement on a substrate. Other processes, including singulating the interposer prior to placing the first die and/or the second die on the interposer, may be used.

Figure 2:
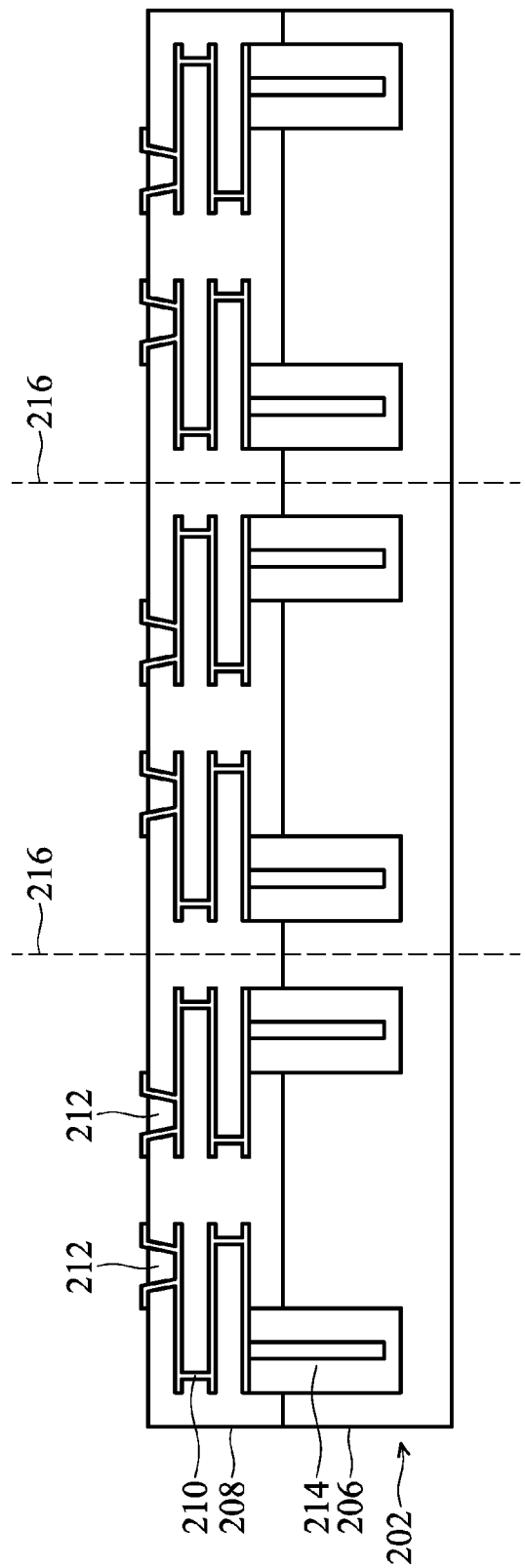
FIGS. 2-9 illustrate various intermediate steps of forming an embodiment.

Referring first to FIG. 2, an interposer 202 is shown in accordance with an embodiment. In an embodiment, the interposer 202 comprises a substrate 206, one or more dielectric layers 208, interconnections 210, contact pads 212, and through substrate vias 214. In general, the substrate 206 is similar to the doped silicon substrate used to form an integrated circuit die. While the substrate 206 may be formed of other materials, it is believed that using silicon substrates for the interposer may reduce the stress because the coefficient of thermal expansion (CTE) mismatch between the silicon substrates and the silicon typically used for the dies is lower than with substrates formed of different materials.

The dielectric layers 208 can be an oxide dielectric or other dielectric materials in which the interconnections 210 may be formed from a conductive material such as aluminum and copper. The interconnections 210 may include, for example, multiple layers of redistribution lines and vias interconnecting adjacent layers of redistribution lines. The interconnections may be formed, for example, of copper, nickel, aluminum, tungsten, titanium, combinations thereof, and/or the like.

The through substrate vias 214, when completed in subsequent processing steps, provide electrically conductive pathways between the contact pads 212 on a first side of the interposer 202 and a second side of the interposer 202, via the interconnections 210. The through substrate vias 214 may be formed by any appropriate method. For example, openings may be formed extending into the substrate 206 by, for example, one or more etching processes, milling, laser techniques, or the like. The openings may be lined with diffusion barrier layers, adhesion layers, isolation layers, and/or the like, and filled with a conductive material. The diffusion barrier layers, for example, may comprise one or more layers of TaN, Ta, TiN, Ti, CoW, or the like, and the conductive material may comprise, for example, copper, tungsten, aluminum, silver, combinations thereof, and/or the like, formed by an electro-chemical plating process, thereby forming the through substrate vias 214.

It should be noted that the interposer 202 illustrates an interposer prior to dicing to form separate packages. In FIG. 2, lines 216 illustrate boundaries, e.g., scribe lines, at which the interposer 202 may be diced upon completion. It should also be noted that two contact pads 212 and two through substrate vias 214 for each package are shown for illustrative purposes only, and that actual devices may have more or less contact pads 212 and through substrate vias 214.

Figure 3:
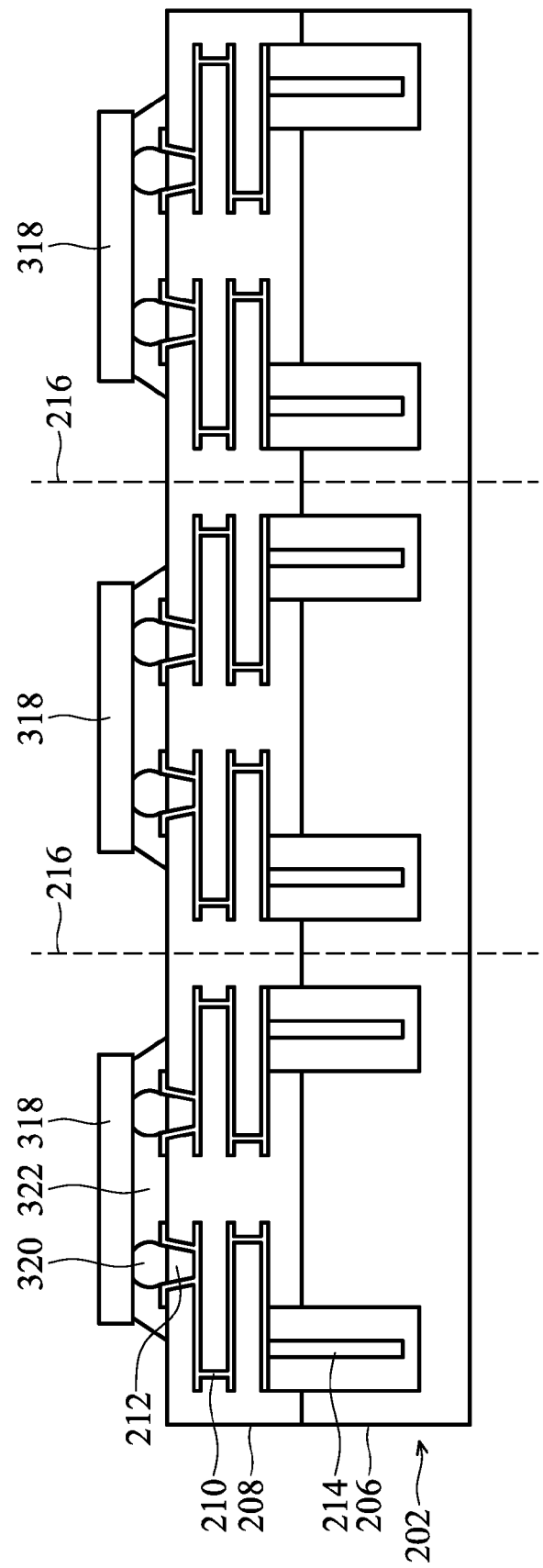

FIG. 3 illustrates placement of first dies 318 onto the interposer 202 in accordance with an embodiment. The first dies 318 may include any suitable circuitry for a particular application. In an embodiment, the first dies 318 are electrically coupled to the interposer 202 in a flip-chip configuration such that contact pads on the first dies 318 face the interposer 202. The contact pads of the first dies 318 are electrically coupled to the contact pads on the interposer 202 via conductive bumps 320, which may be formed by lead free solder, eutectic lead, or the like.

An optional underfill material 322 may be injected or otherwise formed in the space between the first dies 318 and the interposer 202. The underfill material 322 may, for example, comprise a liquid epoxy, deformable gel, silicon rubber, or the like, that is dispensed between the first dies 318 and the interposer 202, and then cured to harden. This underfill material 322 is used, among other things, to reduce cracking in the conductive bumps 320 and to protect the joints from contaminants.

Figure 4:
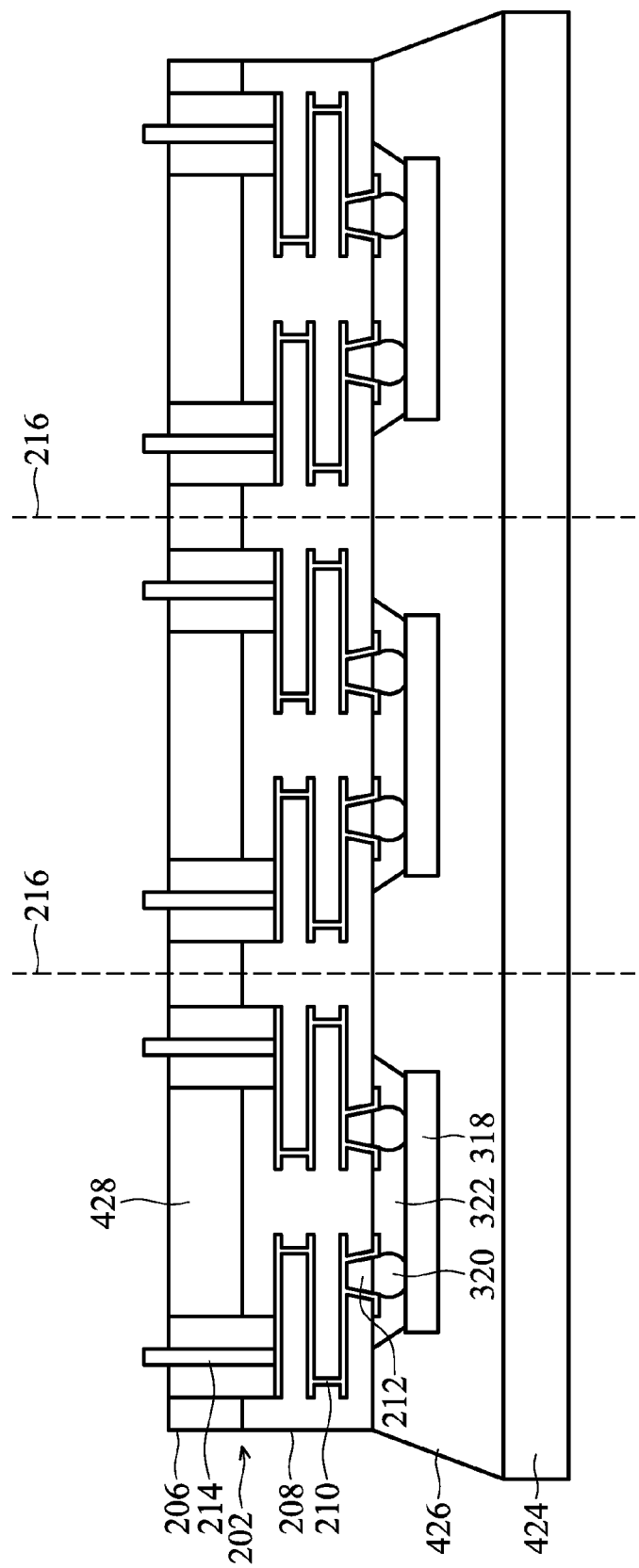

FIG. 4 illustrates attaching a carrier substrate 424 and thinning a backside of the interposer 202 in accordance with an embodiment. The carrier substrate 424 may be attached using an adhesive 426. Generally, the carrier substrate 424 provides temporary mechanical and structural support during subsequent processing steps. In this manner, damage to the interposer 202 is reduced or prevented. The carrier substrate 424 may comprise, for example, glass, silicon oxide, aluminum oxide, and the like. The adhesive 426 may be any suitable adhesive, such as an ultraviolet (UV) glue, which loses its adhesive property when exposed to UV lights.

After attaching the carrier substrate 424 to the interposer 202, a thinning process performed on a backside of the interposer 202 exposes the through substrate vias 214. The thinning process may be performed using an etching process and/or a planarization process, such as a chemical mechanical polishing (CMP) process. For example, initially a planarizing process, such as a CMP, may be performed to initially expose the liner of the through substrate vias 214. Thereafter, one or more wet etching processes having a high etch-rate selectivity between the material of the liner and the interposer 202 may be performed, thereby leaving the through substrate vias 214 protruding from the backside of the interposer 202 as illustrated in FIG. 4. In embodiments in which the interposer 202 comprises silicon, the etch process may be, for example, a dry etch process using $HBr/O_2$, $HBr/Cl_2/O_2$, $SF_6/CL_2$, $SF_6$ plasma, or the like.

After recessing the backside of the interposer 202, a protective layer 428, such as a spin-on glass (SOG) layer is formed. Thereafter, one or more etching steps may be performed to recess the protective layer 428 and to remove the liner, if present. The etching processes may have a high etch-rate selectivity between the material of the protective layer 428/liner and the material of the through substrate vias 214. It should be noted, however, that in other embodiments, the through substrate vias 214 may not protrude from the backside of the interposer 202; any suitable configuration of through substrate vias 214 and the associated interconnects may be used.

Figure 5:
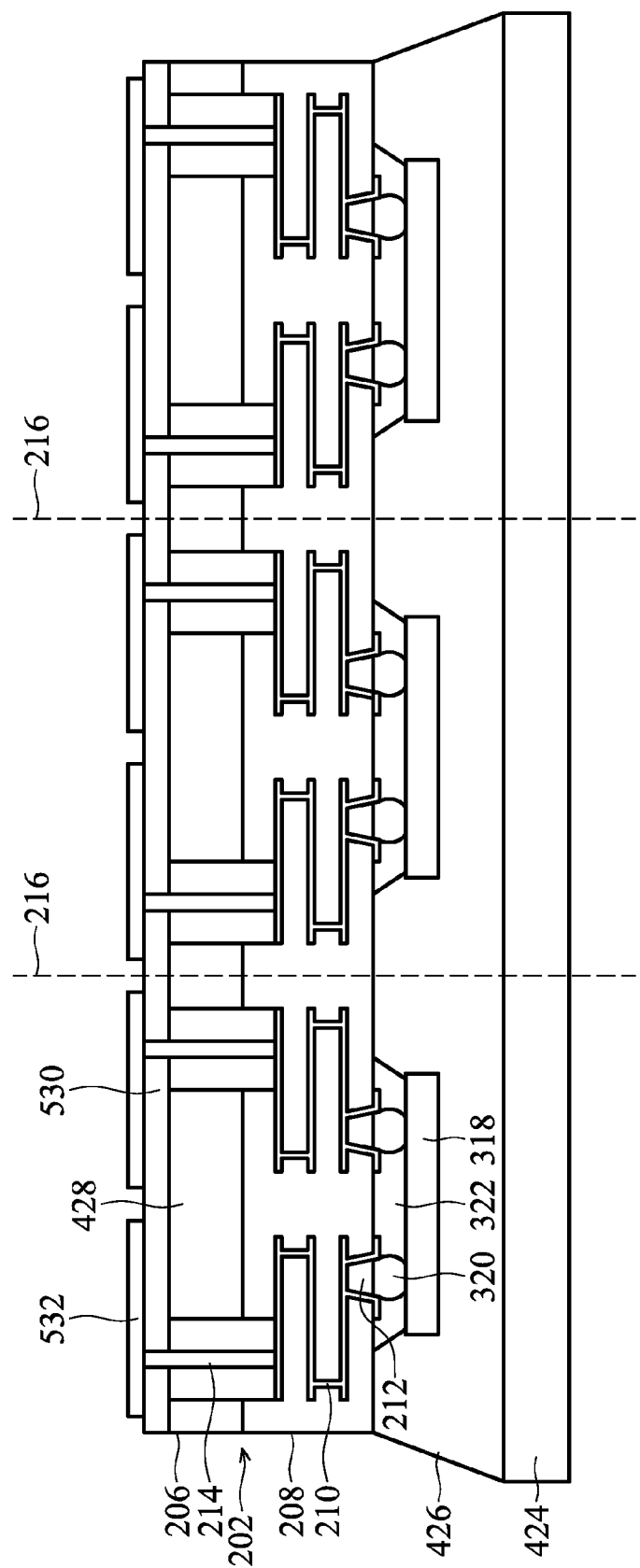

FIG. 5 illustrates formation of a stress buffer layer 530 and a backside RDL 532 in accordance with an embodiment. The stress buffer layer 530 may be formed, for example, of a solder resist material or low-temperature polyimide deposited and etched back to expose the through substrate vias 214. Thereafter the backside RDL 532 may be formed. The backside RDL 532 may be formed of any suitable conductive material, such as copper, copper alloys, aluminum, silver, gold, combinations thereof, and/or the like, formed by any suitable technique, such as electro-chemical plating (ECP), electroless plating, other deposition methods such as sputtering, printing, and chemical vapor deposition (CVD) methods, or the like. A mask (not shown) may also be used.

Figure 6:
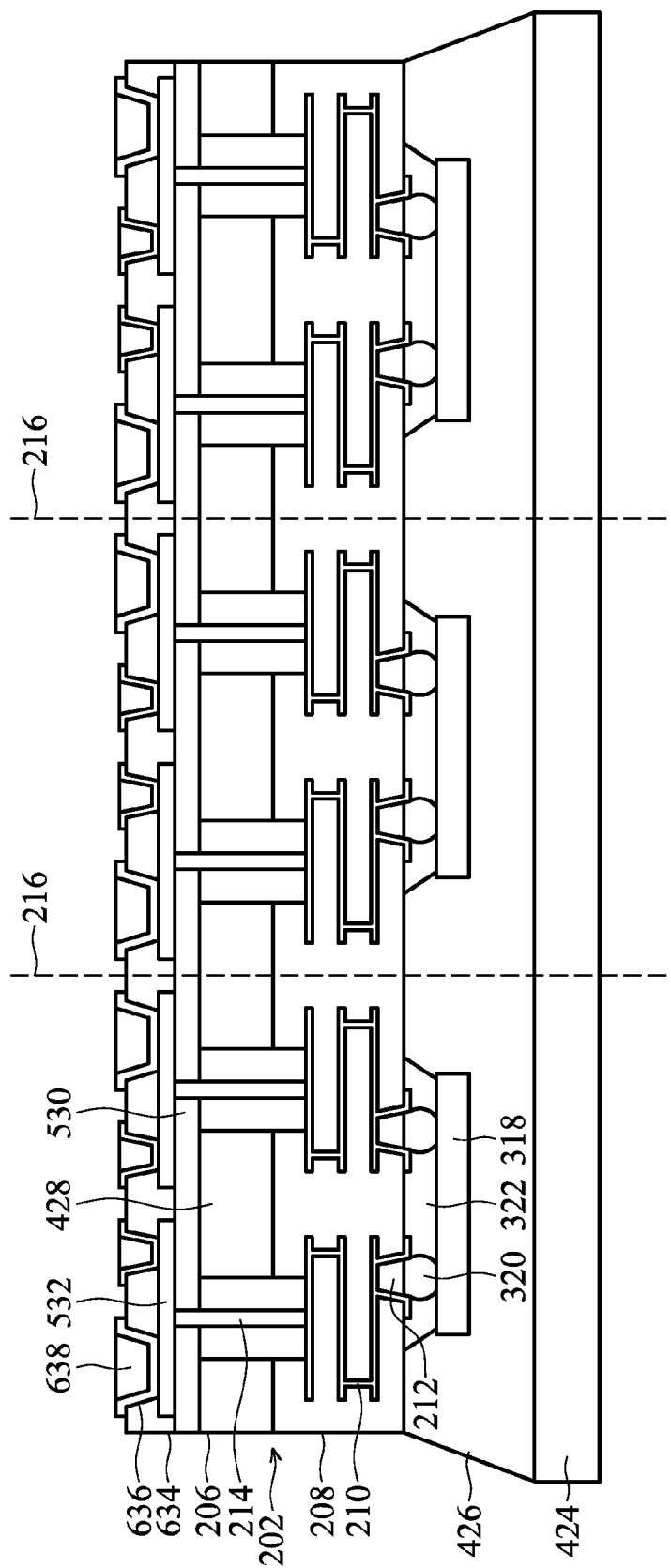

Next, as shown in FIG. 6, a passivation layer 634 is blanket formed and patterned to form openings, in which an under bump metallization (UBM) structure 636 and a presolder 638 are formed. The passivation layer 634 may be formed of nitrides, oxides, polyimide, and the like. The openings in the passivation layer 634 may be formed using photo-lithography techniques such that the openings expose portions of the backside RDL 532. The UBM structures 636 are formed of one or more layers of conductive materials and provide an electrical connection between the backside RDL 532 and the solder bumps to be formed in subsequent processing steps. The UBM structures 636 may be formed, for example, of one or more layers of chrome, a chrome-copper alloy, copper, gold, titanium, titanium tungsten, nickel, combinations thereof, or the like. Once completed, the presolder may be applied to the UBM structures 636.

Figure 7:
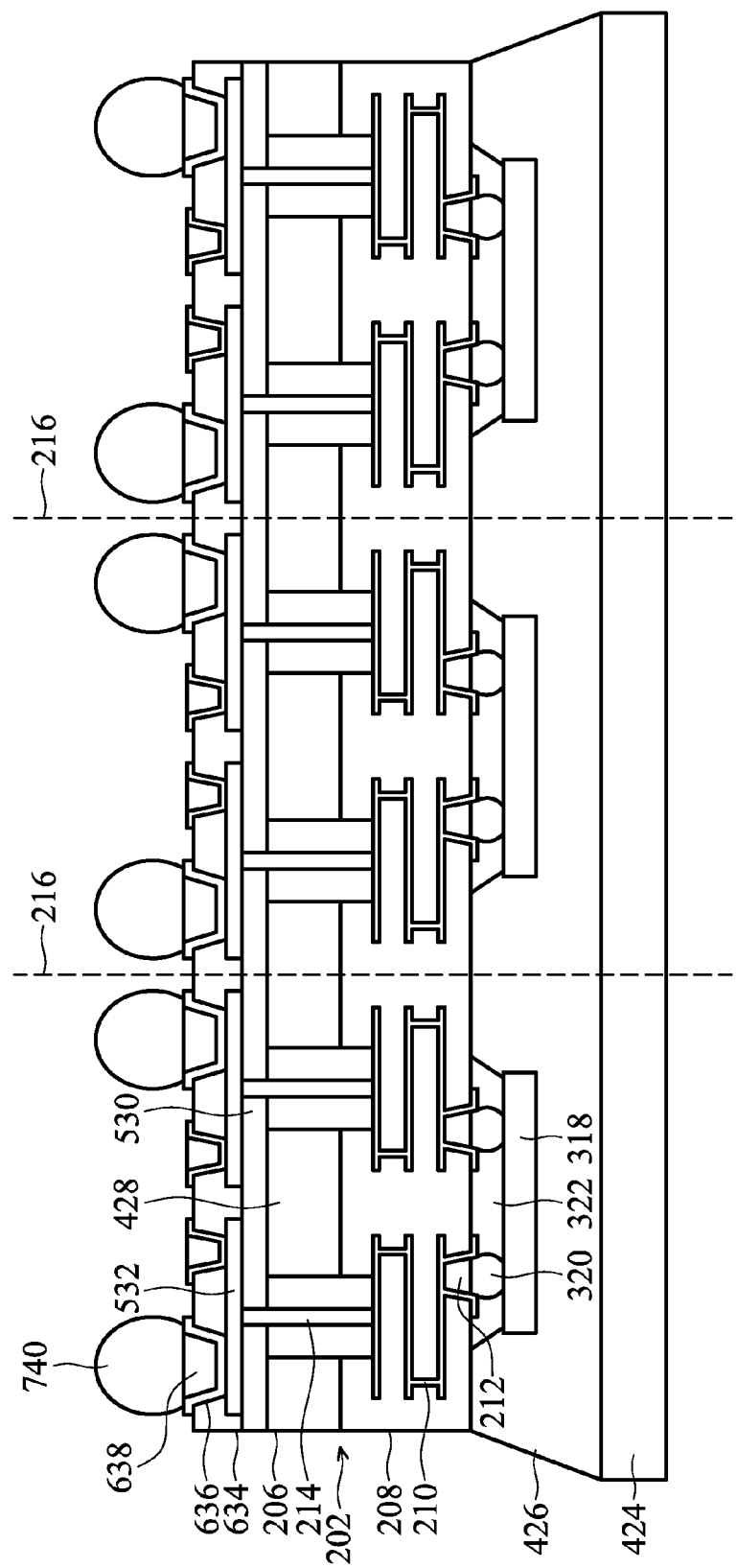

FIG. 7 illustrates conductive bumps 740 placed on select ones of the UBM structures 636 in accordance with an embodiment. The conductive bumps 740 may be formed of a eutectic solder, lead free solder, or the like. As will be discussed in greater detail below, dies will be attached to the UBM structures 636 to which the conductive bumps 740 have not been placed. In order to allow room for the dies, the conductive bumps 740 may be slightly larger than if a die were not attached on both sides of the interposer 202, although as discussed above, the use of a cavity in the underlying substrate may reduce or eliminate the need for a larger bump size. The size of the UBM structures 636 coupled to the conductive bumps 740 may be larger to accommodate the larger size of the conductive bumps 740 as compared to those used to attach dies in subsequent processing steps.

Figure 8:
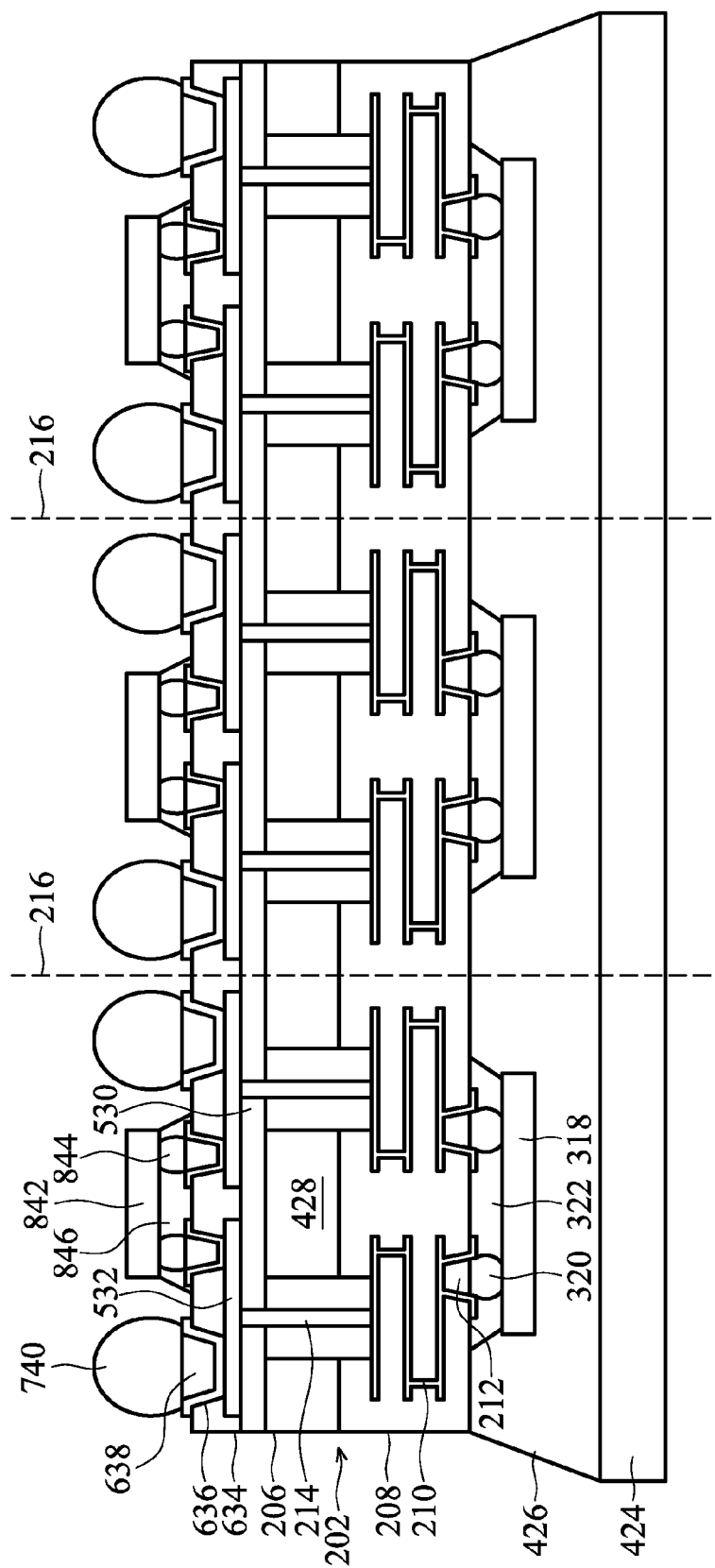

FIG. 8 illustrates placement of second dies 842 among the conductive bumps 740 in accordance with an embodiment. The second dies 842 may include any suitable circuitry for a particular application. In an embodiment, second dies 842 are electrically coupled to the interposer 202 in a flip-chip configuration such that contact pads on the second dies 842 face the interposer 202. The contact pads of the second dies 842 are electrically coupled to the contact pads on the interposer via conductive bumps 844, which may be formed by lead free solder, eutectic lead, or the like.

An optional underfill material 846 may be injected or otherwise formed in the space between second dies 842 and the interposer 202, similar to the underfill material 322 used between the first dies 318 and the interposer 202, to reduce cracking in the conductive bumps 740 and to protect the joints from contaminants. The underfill material 846 may, for example, comprise a liquid epoxy, deformable gel, silicon rubber, or the like, that is dispensed between second dies 842 and the interposer 202, and then cured to harden.

Figure 9:
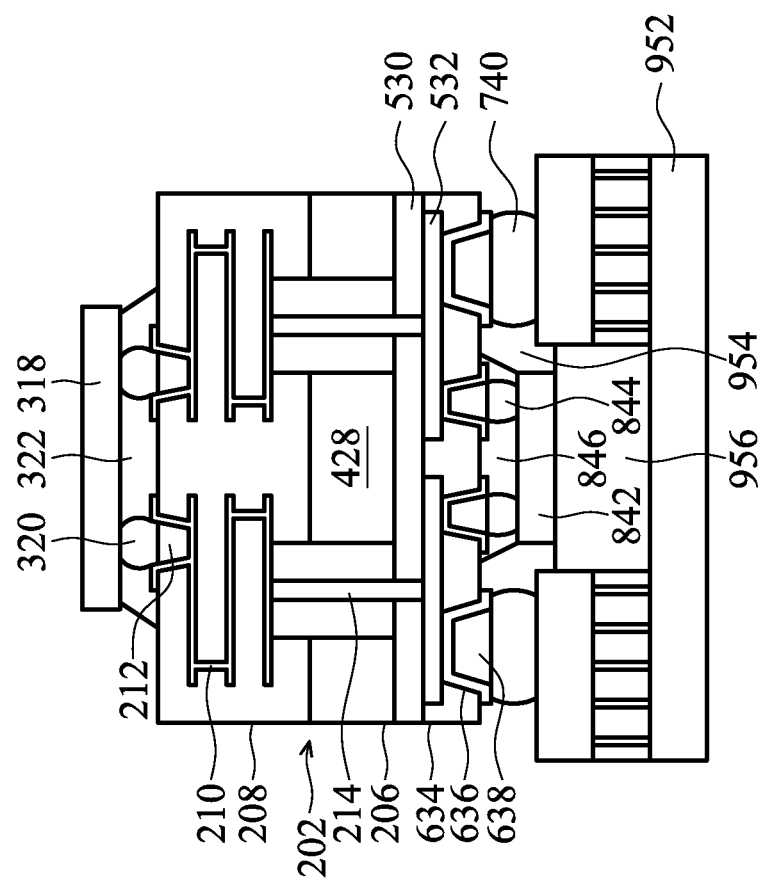

FIG. 9 illustrates the structure illustrated in FIG. 8 after the interposer 202 has been diced and attached to a substrate 952 having a cavity 954 formed therein, such as the substrate discussed above with reference to FIGS. 1a-1d. In this embodiment, the second die 842 is positioned such that the second die 842 extends into the cavity 954. As discussed above, the use of a substrate having a cavity allows for smaller conductive bumps 740 to be used, and hence, a smaller overall package size.

FIG. 9 also illustrates an optional heat dissipation layer 956, which helps dissipate heat away from the second die 842. The heat dissipation layer 956 may, for example, comprise the thermal pad 226, the heat conductive pad 228, and/or the thermal vias 230. The substrate 952 may be formed by any suitable methods.

It has been found that embodiments such as those discussed above may reduce the stress between the dies and the substrate. It is believed that the reduction is due in part to the CTE mismatch being close to zero between the first die 318, the second die 842, and the interposer 202, particularly when a silicon interposer is being used. This type of configuration tends to thermally isolate the first die 318 and the second die 842 from the substrate 952. Furthermore, the connection between the substrate 952 and the interposer 202 is via conductive bumps 740, which are generally larger. Due to the large size, the stress is dispersed over a greater area, thereby creating a stronger joint.

Figure 10:
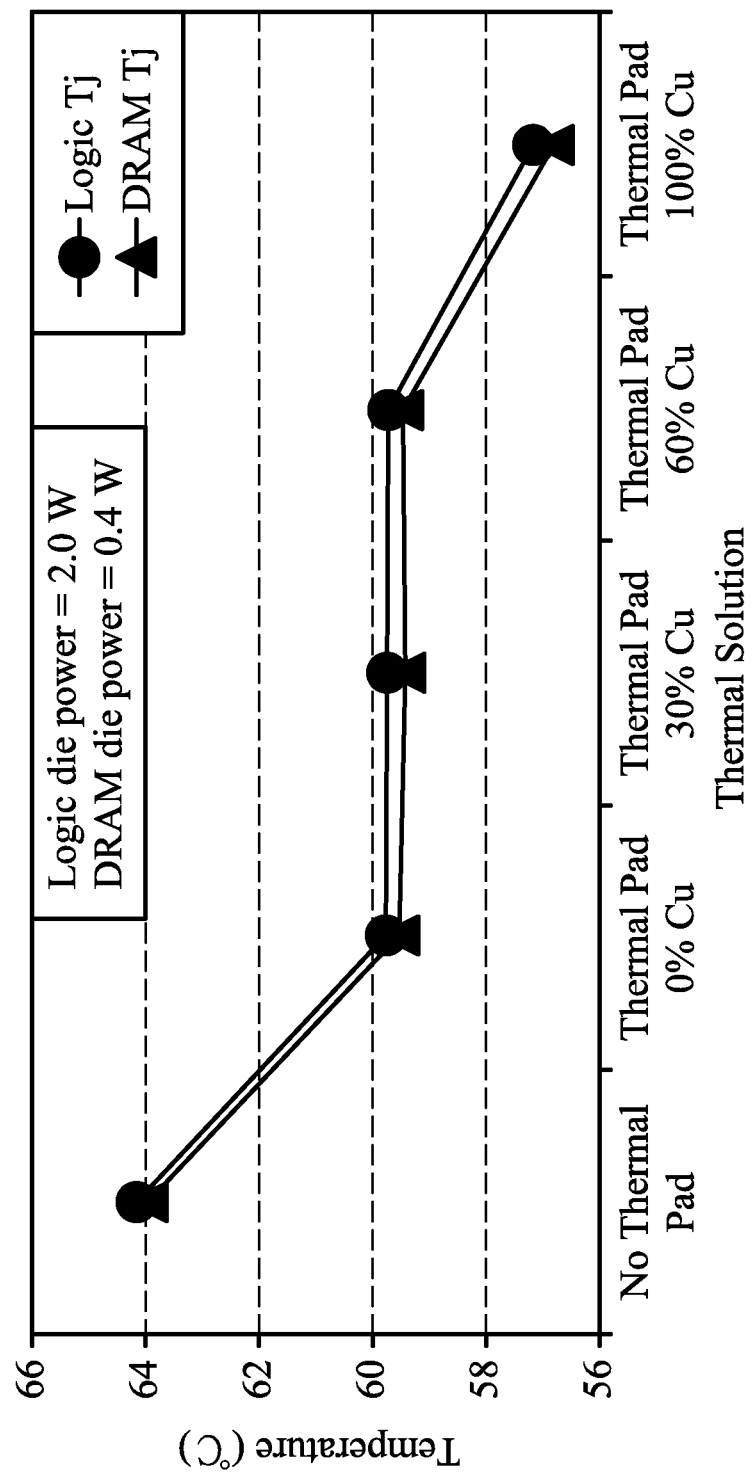
FIG. 10 is a plot representing thermal characteristics that may be obtained with various embodiments.

It has also been found that embodiments such as those discussed above may reduce the operating temperature of the semiconductor device, particularly when both the thermal pad and thermal heat sink are used. For example, FIG. 10 illustrates results that may be obtained by embodiments such as those discussed herein. As illustrated in FIG. 10, the operating temperature of a structure wherein the first die is a logic die operating at 2.0 W and the second die is a DRAM die operating at 0.4 W may be reduce from 64° C. to less than about 58° C. It should be appreciated that since the operating temperature is reduced, power consumption is also reduced.

Figure 11A:
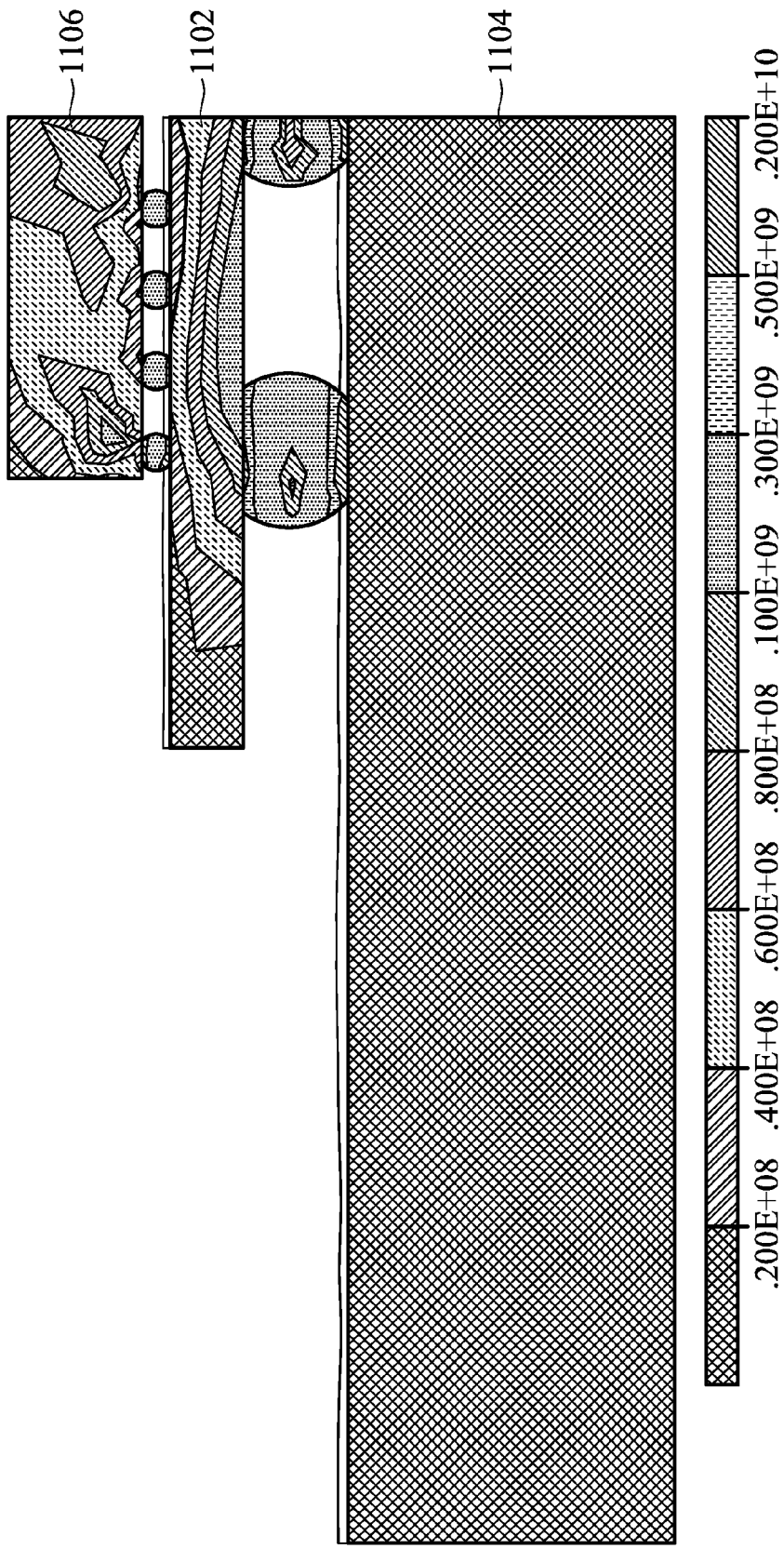
FIGS. 11a and 11b compare stress characteristics of stacked die configurations with and without an interposer.
Figure 11B:
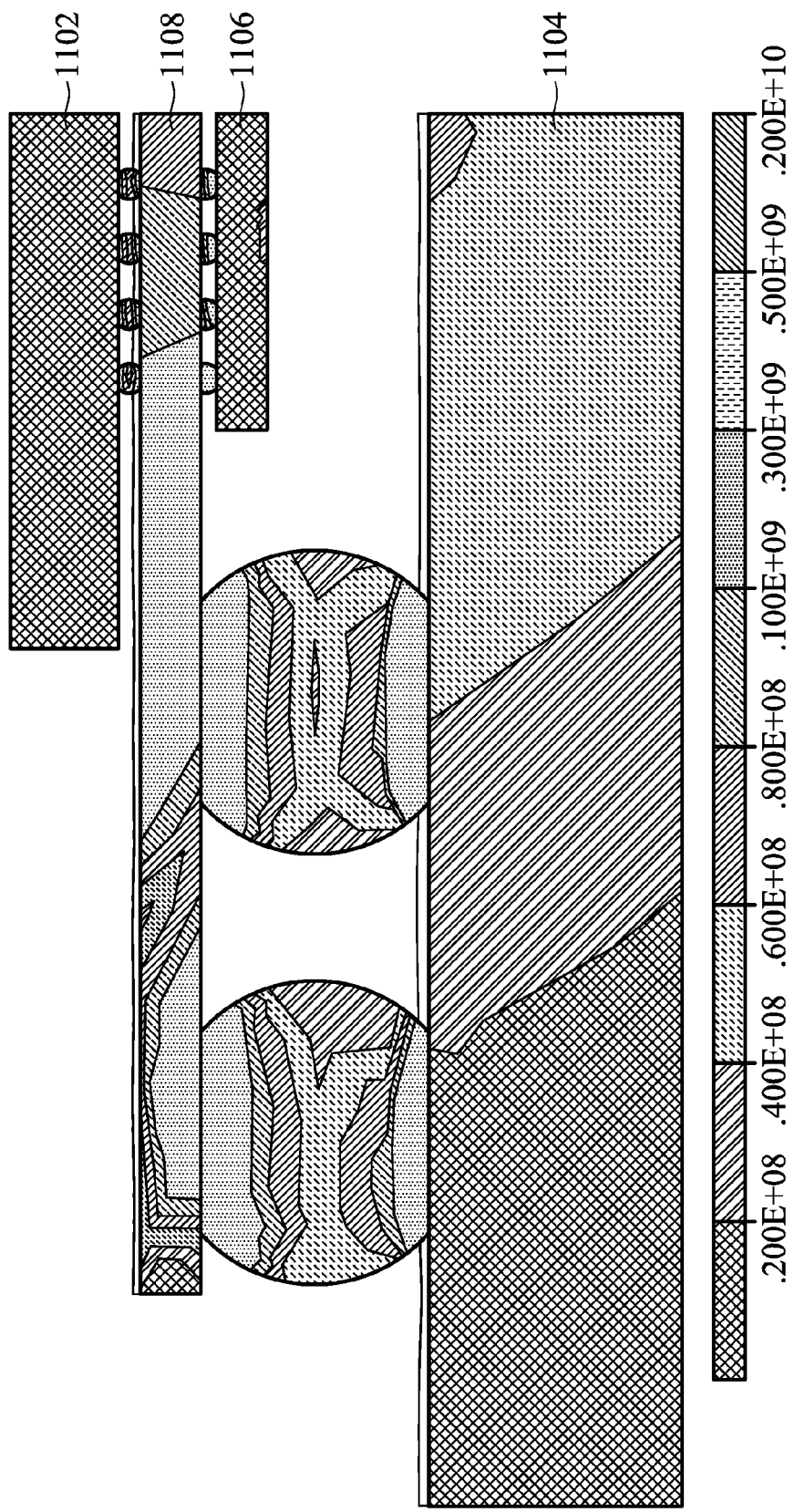

FIGS. 11a and 11b illustrate a comparison between a stacked die configuration with and without an interposer, wherein the simulation scenario used a thermal cycle between 221° C. and 25° C., micro-bumps of about 20 μ, and lead-free (e.g., SnAg) solder. In particular, FIG. 11a illustrates stress that may be seen in a configuration in which a first die 1102 is attached to a substrate 1104, e.g., a 1/2/1 laminate substrate, and a second die 1106 is placed directly on the first die 1102. As can be seen, a significant amount of stress may be seen in the connection between the first die 1102 and the second die 1106. A significant amount of stress may also be seen in the connection between the substrate 1104 and the first die 1102.

In comparison, FIG. 11b illustrates the stress that may be seen in an embodiment such as that discussed above with reference to FIG. 1. In this case the first die 1102 and the second die 1106 are connected to opposing sides of an interposer 1108. As a result of this type of configuration, the maximum amount of stress in the example illustrated in FIG. 11a may be reduced to about 0.845 a.u. compared to a maximum stress of about 2.5 a.u., about a 66% reduction in the maximum stress level. It is believed that this reduction is due in part to the CTE mismatch being close to zero between the first die 1102, the second die 1106, and the interposer 1108, particularly when a silicon interposer is being used. This type of configuration tends to thermally isolate the first die 1102 and the second die 1106 from the substrate 1104.

While these results do not utilize a cavity as discussed above with reference to FIGS. 1a-1d, it is expected that the use of a substrate with a cavity will have similar stress characteristics, but with a smaller overall package size.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a first die;
a second die;
an interposer, the first die being electrically coupled to a first side of the interposer, the second die being electrically coupled to a second side of the interposer; and
a first substrate, the first substrate being electrically coupled at a first side to the second side of the interposer, wherein the substrate includes a cavity extending from the first side partially through the substrate, the second die being positioned within the cavity, and the substrate having at least one through via extending from a first side of the substrate to a second side of the substrate, the substrate configured to be mounted to a second substrate and electrically connecting the at least one via to the second substrate.

2. The semiconductor device of claim 1, further comprising a thermal pad layer along a bottom of the cavity.

3. The semiconductor device of claim 1, wherein the first substrate further comprises a heat conductive layer under the cavity.

4. The semiconductor device of claim 3, wherein the heat conductive layer extends from a surface of the cavity to an opposing side of the first substrate.

5. The semiconductor device of claim 1, wherein the first substrate is electrically coupled to the second side of the interposer using solder bumps having a diameter of 80 μm or less.

6. The semiconductor device of claim 5, wherein the solder bumps have a collapsed height of 60 μm or less.

7. The semiconductor device of claim 1, wherein the interposer is a silicon interposer.

8. The semiconductor device of claim 1, wherein the first substrate is a laminate substrate.

9. The semiconductor device of claim 1, wherein one of the first die and the second die comprises a logic circuit and the other of the first die and the second die is a memory.

10. A semiconductor device comprising:
an interposer having bond pads on a first side and a second side;
a first die attached to the bond pads on the first side of the interposer by a first plurality of conductive bumps;
a second die attached to the bond pads on the second side of the interposer by a second plurality of conductive bumps; and
a substrate, the substrate being attached at a first side to the bond pads on the second side of the interposer by a third plurality of conductive bumps, the substrate having a cavity extending from the first side partially through the substrate, the second die being positioned within the cavity, wherein a second side of the substrate is planar.

11. The semiconductor device of claim 10, further comprising a thermal gap filler material in the cavity between the second die and the substrate.

12. The semiconductor device of claim 10, wherein the substrate further comprises a heat conductive layer under the cavity.

13. The semiconductor device of claim 12, wherein the heat conductive layer extends from a surface of the cavity to an opposing side of the substrate.

14. The semiconductor device of claim 10, wherein the interposer is a silicon interposer.

15. The semiconductor device of claim 10, wherein the substrate is a laminate substrate.

16. A semiconductor device comprising:
- a first die;
- a second die;
- an interposer, the first die being electrically coupled to a first side of the interposer, the second die being electrically coupled to a second side of the interposer;
- a substrate, the substrate being electrically coupled to the second side of the interposer, wherein the substrate includes a cavity extending from a first side of the substrate into the substrate, the second die being positioned within the cavity; and
- a heat conductive layer disposed within the cavity and extending from the cavity to a second side of the substrate, a first side of the heat conductive layer substantially level with the second side of the substrate, the second die disposed between the heat conductive layer and the interposer.

17. The device of claim 16, and the substrate having at least one through via extending from the first side to a second side, the substrate configured to be mounted to a target substrate and electrically connecting the at least one via to the target substrate.

18. The device of claim 16, wherein the heat conductive layer comprises a thermal gap filling material.

19. The device of claim 16, wherein the substrate is electrically coupled to the second side of the interposer using solder bumps having a diameter of 80 μm or less.

* * * * *